United States Patent [19]

Barton

[11] Patent Number: 4,842,950

[45] Date of Patent: Jun. 27, 1989

[54] OVERLAY PROOFING FILM

[75] Inventor: O. Alfred Barton, Florham Park, N.J.

[73] Assignee: Hoechst Celanese Corporation, Somerville, N.J.

[21] Appl. No.: 199,011

[22] Filed: May 26, 1988

Related U.S. Application Data

[62] Division of Ser. No. 691,313, Jan. 14, 1985, abandoned, and Ser. No. 927,191, Nov. 4, 1986, Pat. No. 4,748,101.

[51] Int. Cl.$^4$ .................... B32B 27/08; B32B 27/30; B32B 27/36; G03C 1/80
[52] U.S. Cl. ................................ 428/483; 430/160; 430/167; 430/271
[58] Field of Search ............... 430/160, 252, 272, 527; 430/293, 176, 156, 296, 285; 428/483, 480; 427/173, 44, 128

[56] References Cited

U.S. PATENT DOCUMENTS

| | | | |
|---|---|---|---|
| 3,526,504 | 9/1970 | Celeste | 430/272 |
| 4,113,918 | 9/1978 | Kugura et al. | 430/527 |
| 4,129,489 | 12/1978 | Christenson et al. | 427/44 |
| 4,157,918 | 6/1979 | Wanat et al. | 430/176 |
| 4,191,572 | 3/1980 | Cohen et al. | 430/293 |
| 4,224,270 | 9/1980 | Pears | 427/173 |
| 4,225,665 | 9/1980 | Schadt | 430/160 |
| 4,299,906 | 11/1981 | Liu | 430/293 |
| 4,304,836 | 12/1981 | Cheema et al. | 430/252 |
| 4,311,784 | 1/1982 | Fran | 430/160 |
| 4,347,300 | 8/1982 | Shimazu et al. | 430/156 |
| 4,400,847 | 4/1984 | Whittemore | 430/160 |
| 4,430,419 | 2/1984 | Harada | 430/296 |
| 4,465,572 | 8/1984 | Graham | 430/285 |
| 4,490,505 | 12/1984 | Pendergrass | 427/128 |

FOREIGN PATENT DOCUMENTS

| | | | |
|---|---|---|---|
| 1484 | 4/1979 | European Pat. Off. | 430/160 |
| 1128837 | 10/1968 | United Kingdom | 430/160 |
| 1497101 | 1/1978 | United Kingdom | 430/160 |

*Primary Examiner*—Thomas J. Herbert
*Attorney, Agent, or Firm*—Richard S. Roberts

[57] ABSTRACT

An improved overlay proofing film comprising a substantially transparent polyester base film which is first coated on one or both sides with a non-light sensitive composition having a refractive index of about 1.6, said non-light sensitive composition consisting essentially of a copolymer of polymethyl methacrylate and methacrylic acid.

20 Claims, No Drawings

OVERLAY PROOFING FILM

This application is a division of U.S. patent application Ser. No. 06/691,313 filed Jan. 14, 1985, now abandoned; and is a division of U.S. patent application Ser. No. 06/927,191 filed Nov. 4, 1986, now U.S. Pat. No. 4,748,101.

BACKGROUND OF THE INVENTION

This invention relates to an overlay proofing film having a base film with improved transparency. In the graphic arts, it is desirable to produce a four or more color proof to assist a printer in correcting a set of color prints prior to using them to produce color plates and also to reproduce the color quality that will be obtained during the printing process. The proof must be a consistent duplication of the half tone, and should neither gain nor lose color. Visual examination of a color proof should show the following characteristics:

1. Defects on the negative.
2. The best color rendition to be expected from press printing of the material.
3. The correct gradation of all colors and whether grays are neutral.
4. The need, if any, for subduing one of the colors and/or giving directions for altering the film negatives before making the printing plates.

A method of transferring colored images has been applied to the preparation of a color proofing sheet in multicolor printing. Thus, color proofing sheets, for multi-colored printing, have heretofore been made by using a printing press or a proof press while taking all the steps necessary for actual multicolor printing, but such a conventional method of color proofing has been costly and time consuming.

Photographic processes have also been used, especially photographic processes using photopolymers. The usual type of photographic color proofing method is the overlay type.

In the overlay type of color proofing method, an independent transparent plastic support is used for producing a print of each color separation film by applying a photosensitive solution of the corresponding color, and a plurality of such supports carrying prints of corresponding colors are then superimposed upon each other to produce a color proofing sheet. The overlay type of color proofing method has the disadvantage that the grayness and density of the superimposed plastic supports tend to darken the color proofing sheet, and, as a result, the impression of the color proofing sheet thus prepared becomes vastly different from copies actually obtained by a conventional printing press or a proof press. Its primary advantage is that it is quick and can serve as a progressive proof by combining any two or three colors in register.

As mentioned above, the typical proof sheet adapted for imagewise color exposure consists in the most elementary form of a transparent base sheet coated on one side with a light sensitive composition containing a dyestuff. Most commonly with negative acting materials, the light sensitive composition may be composed of a diazo material, used either alone or in combination with a resinous binder, which composition is caused to harden by exposure to a source of actinic light. The hardening occurs as the result of a photopolymerization, condensation, or coupling reaction which renders the light struck areas insoluble in common developer solutions such as aqueous developers, while the non-light struck areas remain substantially chemically unaltered and soluble. Once developed, the light struck areas of the coating exposed through a negative transparency remain adhered to the base sheet in the form of an image.

In order to overcome the above-stated darkening problem, it is desired that a proofing film be obtained wherein the base film has improved clarity and transparency.

SUMMARY OF THE INVENTION

This invention relates to an improved overlay proofing film. More particularly, the invention relates to an improved overlay proofing film comprising a substantially transparent polyester base film which is first coated on one or both sides with a non-light sensitive composition having a refractive index of less than about 1.6, said non-light sensitive composition consisting essentially of a copolymer of polymethyl methacrylate and methacrylic acid, said coated polyester base film having a second coating on either side thereon, said second coating comprising a light sensitive mixture of
a. a resinous binder;
b. a colorant; and
c. a light sensitive material.

DETAILED DESCRIPTION OF THE INVENTION

The present invention provides a proofing film wherein the polyester base film exhibits substantially improved transparency and clarity. In general, it has been found that a suitable anti-reflectance coating for polyester film should be transparent and have a refractive index (R.I.) lower than the refractive index of the polyester film itself (R.I.=1.6). An oversimplification of the mechanism of this phenomena is that the light that would normally bounce from surface to surface of the film now can be emitted through the lower refractive index coating giving the advantage of improved film transparency.

The flexible polyester film of the present invention may be any flexible film formed from any thermoplastic film forming polyester which is produced by condensing a dicarboxylic acid or a lower alkyl diester thereof with a glycol. Among the dicarboxylic acids and their lower alkyl diesters which may be employed to form a flexible polyester film support are terephthalic; isophthalic; phthalic; 2,5-, 2,6, and 2,7-naphthalene dicarboxylic; succinic; sebacic; adipic; azelaic; dibenzoic; the hexahydrophthalics; and bis-p-carboxyphenoxyethane. One or more of these acids and/or their lower alkyl diesters is reacted with one or more glycols which include ethylene glycol; diethylene glycol; 1,3-propanediol; 1,4-butanediol; neopentyl glycol or 1,4-cyclohexanedimethanol. Since one or more diesters may be reacted with one or more glycols, the polyester film of this invention is not limited to homopolyesters, but also includes mixed polyesters such as copolyesters.

Of the film forming polyesters within the contemplation of this invention, preferred are those containing at least a major amount of polyethylene terephthalate, the most preferred being polyethylene terephthalate. Polyethylene terephthalate film is formed from a polymer produced by polymerization of bis-(2-hydroxyethyl) terephthalate. Bis-(2-hydroxyethyl) terephthalate is itself formed as an intermediate by one of two different methods. One method for producing bis-(2-hydroxyethyl) terephthalate is by direct esterification of terephthalic acid with ethylene glycol as described in U.S. Pat. No. 3,050,533. In this method, the by-product of the reaction is water which is distilled from the reaction product. A second method for producing bis-(2-hydroxyethyl) terephthalate is by transesterification of a dialkyl ester of terephthalic acid, preferably dimethyl terephthalate, with ethylene glycol. Preferably, two molecular proportions of ethylene glycol react with one molecular proportion of the dialkyl terephthalate. More preferably, more than two molecular proportions of ethylene glycol per molecular proportion of the dialkyl terephthalate are used since under these conditions the initial transesterification reaction occurs more rapidly and completely. The transesterification reaction is conducted under conditions of elevated temperature. For example, a temperature in the range of between about the boiling temperature of the reaction mixture to as high as about 250° C. may be used. The reaction can occur at atmospheric, sub-atmospheric or super-atmospheric pressure. The by-product of the transesterification reaction is an alkanol. For example, if dimethyl terephthalate is used, methanol is produced. The alkanol is removed from the reaction product. In order to increase the reaction rate, many known catalysts may be employed in the transesterification reaction, as desired.

After the bis-(2-hydroxyethyl) terephthalate has been produced, it may be converted to polyethylene terephthalate by heating at a temperature above the boiling point of the ethylene glycol or the reaction mixture under conditions affecting the removal of the glycol or water. The heating may occur at a temperature as high as about 325° C., if desired. During heating, pressure is reduced so as to provide rapid distillation of the excess glycol or water. The final polyethylene terephthalate polymer may have an intrinsic viscosity, as measured in orthochlorophenol at 25° C., in excess of about 0.3 deciliter per gram. More preferably, the intrinsic viscosity of the polymer ranges from about 0.4 to about 1.0 deciliter per gram, again measured in orthochlorophenol at 25° C. Still more preferably, the polyethylene terephthalate employed in the present invention has an intrinsic viscosity of about 0.5 to about 0.7 deciliter per gram as measured in orthochlorophenol at 25° C.

In a preferred embodiment, the polyester film forming polymer is melted and thereafter extruded onto a polished revolving casting drum to form a cast, flexible sheet of the polymer. Thereafter, the film is axially stretched in one direction, either in the direction of extrusion (longitudinal), or perpendicular to the direction of extrusion (transverse) in the case of monoaxially oriented film, and in two directions in the case of biaxially oriented film, that is, the film is stretched in both the longitudinal and transverse directions. The first stretching step of the cast sheet may be in either or these two orthogonal directions. The amount of stretching, to impart strength and toughness to the film, can range from about 3.0 to about 5.0 times the original cast sheet dimension in one or both directions. Preferably, the amount of stretching is in the range of between about 3.2 and 4.2 times the original dimension. The stretching operations are carried out at temperatures in the range of from about the second order transition temperature to below the temperature at which the polymer softens and melts. It is important that the stretching temperature is above the glass transition temperature of the film. The film is then crystallized by heating to a temperature of from about 130° C. to about 240° C., preferably 150° C. to 180° C., while being transversely restrained but without film stretching. Crystallizing is normally complete when this treatment is performed for about five seconds or more. The film is then cooled to substantially ambient atmospheric room temperature. The thusly produced film may have a thickness of from 0.48 to 30 mils, preferbly 1 to 9 mils, most preferably 3 to 7 mils.

The thusly formed polyester film is then coated with a non-light sensitive first coating composition having a refractive index of less than about 1.6 which consists essentially of a copolymer of polymethyl methacrylate and methacrylic acid. The use of the term "consists essentially of" is meant to exclude from the non-light sensitive composition any materials which, if present, would seriously detract from the composition's ability to render polyester film more transparent. The components of the copolymer may be present in roughly equal amounts but it is preferred that polymethyl methacrylate comprise the majority of the copolymer. Most preferably, the copolymer comprises about 80% to about 95% of polymethyl methacrylate and about 5% to about 20% of methacrylic acid.

The polymethyl methacrylate/methacrylic acid copolymer of this invention may be manufactured by any conventional method known to the polymer chemist, for instance by solution polymerization or dispersion (or emulsion) polymerization, such as described in U.S. Pat. No. 4,465,572 and 4,430,419. Preferably, the copolymer is manufactured by solution polymerization, as this obviates the need to filter the coating solution prior to coating.

The first coating composition may optionally include a curing agent for curing the copolymer. Although curing the copolymer has no significant effect on the improved transparency of the polyester base film, to do so will help the first coating to adequately resist the solvent system of a light-sensitive mixture applied thereon. Preferred curing agents are the polyfunctional aziridines. Specific curing agents which are useful in the practice of this invention include trimethylolpropane-tris-($\beta$-(N-aziridinyl) propionate), which is available as XAMA-2 from Cordova Chemical Company of North Muskegon, Mich., and pentaerythritol-tris-($\beta$-(N-aziridinyl) propionate), which is available as XAMA-7 from Cordova Chemical Company of North Muskegon, Mich. If desired, an accelerator for the cure of the copolymer may also be added to the first coating, such as triethanolamine.

The first coating may be applied to the polyester base film by forming a solution or dispersion of the coating materials in suitable solvent(s). Solvents should be selected based on the solubility characteristics of the coating materials. Suitable solvents include dimethyl sulfoxide, dimethyl formamide, tetrahydrofuran, glycol ethers such as propylene glycol mono methyl ether, ethylene glycol mono methyl ether and ethylene glycol mono ethyl ether, esters such as ethyl acetate, butyl acetate and amyl acetate, ketones such as methyl ethyl ketone, cyclohexanone and diacetone alcohol, and mixtures of the above. Coating may be effected by any of the techniques well known to those skilled in the art, such as by roller coating, slot coating, spray coating, gravure coating or kiss coating. Preferably, the polyester film is coated with the first coating by means of kiss coating. The solvents may then be dried off by methods known to those skilled in the art, although some residue may remain.

In the preferred embodiment, the film is coated with the first coating at a coating weight of at least about 0.5 g/m². The upper coating weight limit is that above which the film shows inflexibility and the tendency to crack on handling and is generally about 7.0 g/m². More preferbly, the first coating is present at a coating weight of from about 1.0 g/m² to about 6.0 g/m² and most preferably is about 20 g/m² to about 5.0 g/m². Additionally, it is preferred that the first coating be coated on both sides of the polyester film since film coated on both sides shows improved transparency over film coated on one side only, although each show substantial improvement over uncoated film.

The polyester film coated with the first coating is then coated with a second coating which comprises a light sensitive mixture of
  (a) a resinous binder;
  (b) a colorant; and
  (c) a light sensitive material.

The components of the light sensitive mixture of the present invention may be the conventional components which are known in the art for such coatings used in positive acting or negative acting light sensitive systems. The resinous binder material may be any of the known prior art binders which have been disclosed either for positive acting or negative acting light sensitive coating compositions.

In negative acting systems, the binder material may be relatively inert to photochemical reaction, serving merely as a carrier for the light sensitive materials, colorants, and other additives which may be present in the coating composition. Exemplary of suitable binder materials include cellulose esters such as cellulose acetate, cellulose acetate succinate and cellulose acetate butyrate; polyvinyl actals such as polyvinylbutyral and polyvinyl formal; polyamide resins; copolymers of vinyl chloride with polar monomers such as acrylonitrile, acrylic of methacrylic acid of their esters, and with vinyl acetate; polymeric esters such as polyvinyl acetate or copolymers of vinyl acetate with acrylic acid, methacrylic acid and their esters, or with maleic acid or maleic anhydride; copolymers of styrene with acid functional comonomers such as ethyl acrylate, vinyl acetate and maleic anhydride; natural polymers such as gelatin, casein or fish glue; polyvinyl alcohol; polyacrylamides; and like materials. In a positive acting system, the resinous binder materials most commonly employed are selected from alkali soluble resins such as phenol/formaldehyde novolak resins and like materials. Preferably, the binder material is a copolymer of polymethyl methacrylate and methacrylic acid.

The coloring agents employed in the present invention include those dyestuffs and pigments which are known in the art and which have colors substantially identical with the standard colors of ink required for color proofing, e.g. yellow, cyan, magenta and black. Examples of suitable colorants include Grasol Fast Yellow 5FL (C.I. Solvent Yellow 27), Grasol Fast Rubine 2BL (C.I. Solvent Red 128), Victoria Pure Blue FGA (C.I. Basic Blue 81), Neozapon Yellow GG (C.I. Solvent Yellow 79), Neozapon Fast Red BE (C.I. Solvent Red 122), Sudan Blue II (C.I. Solvent Blue 35-C.I. 6155(S), Victoria Cyan F6G (C.I. 42025), Rhodamine FB (C.I. 45170), Rhodamine 6GDN Extra (C.I. 41560), Auramine Concentrate (C.I. 41000), carbon black and like materials.

Light sensitive materials which are preferably used in the practice of the present invention include any suitable light-sensitive diazonium salt which are well known to the skilled artisan. Preferred are the polymeric diazonium compounds including those condensed with formaldehyde such as disclosed in U.S. Pat. Nos. 2,063,631 and 2,667,415, the polycondensation products such as disclosed in U.S. Pat. Nos. 3,849,392 and 3,867,147, and the high speed diazos such as disclosed in U.S. Pat. No. 4,436,804, all of which are hereby incorporated herein by reference.

The most preferred of these diazonium salts is the condensation product of 3-methoxy-4-diazo diphenyl amine and 4,4'-bis-methoxy methyl diphenyl ether, isolated as the mesitylene sulfonate, such as is taught in U.S. Pat. No. 3,849,392.

Other compositions useful as the light sensitive material of this invention include those photomonomers or oligomers in conjunction with a photoinitiator wherein the solvent system used to apply them to the film is not so hard or severe as to interfere with the non-light sensitive composition already coated on the film.

It is to be emphasized that the specific light sensitive compositions which may be employed in the present invention are conventional in the art and should be selected by one skilled in the art based on compatibility and operability in the binder system disclosed herein.

The light sensitive coating compositions may be most conveniently applied to the film substrate by forming a solution or dispersion of the coating ingredients in suitable solvent(s), applying the desired quantity of the solution to the surface of the film by any suitable technique such as roller coating, dip coating, miniscus coating, doctor blade coating or whirler coating, and drying to evaporate the solvent although there may be some residue remaining. The light sensitive coating composition may be coated on either side of the coated polyester base film, even if the non-light sensitive first coating is coated on only one side of the polyester base film. Suitable solvents which may be employed should be selected based on the solubility characteristics of the light sensitive compositions and include dimethyl sulfoxide, dimethyl formamide, tetrahydrofuran, glycol ethers such as propylene glycol mono methyl ether, ethylene glycol mono methyl ether and ethylene glycol mono ethyl ether, esters such as ethyl acetate, butyl acetate and amyl acetate; ketones such as methyl ethyl ketone, cyclohexanone and diacetone alcohol, and mixtures thereof.

The composition of the coating on a dry basis generally should range in the order of about 25 to 75% by weight of binder material. An effective amount of a colorant is generally in the range of about 2 to 15% by weight and effective amounts of the light sensitive materials as are known in the art. The concentration of the solids in the coating solution prior to application to the substrate and drying depends upon the coating method used in depositing the coating, but generally solutions containing from about 2 to 20% by weight solids are satisfactory.

In the preferred embodiment, the second coating is present at a coating weight of from about 3.5 g/m² to about 7.5 g/m². More preferably, the second coating is present at about 4.0 g/m² to about 6.0 g/m². The most preferred coating weight for the second coating is about 5.0 g/m².

The thusly prepared overlay proofing film may then be exposed to actinic light through a suitable mask or contact flat and then developed with an aqueous alkaline developer. Suitable developers may include components such as monosodium phosphate, trisodium phosphate and the sodium sulfate derivative of 7-ethyl-2-methyl-4-undecanol.

The following examples illustrate the fact that although other coatings also have a refractive index (R.I.) lower than polyester film, the coatings of this invention are the ones which may be used successfully to form a proofing film with increased transparency. It is to be understood that the following examples are merely illustrative of the invention, which should not be limited thereto.

EXAMPLE 1

Thin films of five different coating resins, each having an R.I. less than polyester film are coated on Melinex 516, a polyester film subbed with nodules of silica to facilitate handling and eliminate the effects of static, obtained from I.C.I., and the resultant films checked for opacity, ability to be wet by light-sensitive topcoat and solvent resistance. The results are shown in Table 1.

TABLE 1

| Coating | R.I. | Comments |
| --- | --- | --- |
| (1) Polytetrafluoroethylene | 1.35 | too opaque; light-sensitive coating will not wet the surface; solvent resistance acceptable |
| (2) Silicones (Syl-off 294 obtained from Dow-Corning) | 1.43 | transparent but will not wet with light-sensitive coating; solvent resistance acceptable when crosslinked |
| (3) 85% Polymethyl methacrylate 15% Methacrylic Acid (prepared by dispersion polymerization) | 1.49 | transparent; will wet; solvent resistant acceptable when crosslinked |
| (4) 95% Polymethyl methacrylate 5% Methacrylic acid (prepared by dispersion polymerization) | 1.49 | Transparent; will wet; solvent resistance acceptable when crosslinked |
| (5) 85% Polymethyl methacrylate 15% Methacrylic Acid (prepared by solution polymerization) | 1.49 | Transparent; will wet; solvent resistance acceptable when crosslinked |

The coatings of this invention (3, 4 and 5) are the only ones which show acceptable performance when a light sensitive topcoat is applied.

EXAMPLE 2

23.75 g of a copolymer of 85% polymethyl methacrylate/15% methacrylic acid prepared by conventional dispersion polymerization (10% solids in methyl cellosolve) is dissolved in a 50/50 mixture of methyl cellosolve and methyl ethyl ketone (525 g) under moderate stirring and gives a clear solution. 0.5 g of triethanolamine is then added and stirring continued. 1.25 g of trimethylolpropane-tris-($\beta$-(N-aziridinyl) propionate) is then added to the formulation and the stirring continued for a period of 30 minutes to insure complete mixing. The solution is then filtered through a #4 Whatman filter paper before coating. The solution is then coated on both sides of 3 mil Melinex 516 polyester film at a coating weight of 0.5 g/m$^2$ using a kiss coating method of application. The coated film is then placed in an oven for about 1 minute at a drying temperature of 275° F. The transparency of the resultant film is then measured spectrophotometrically on an IBM-7410 spectrophotometer. The results are shown in Table 2.

EXAMPLE 3

A coating solution is prepared as described in Example 2 and coated on both sides of a 3 mil Melinex 516 polyester film at a coating weight of 1 g/m$^2$. The transparency of the resultant film is then determined by spectrophotometric transmission readings on an IBM-7410 spectrophotometer. The results are shown in Table 2.

EXAMPLE 3A

A coating solution is prepared and coated as described in Example 3 except that the triethanolamine and trimethylolpropane-tris-($\beta$-(N-aziridinyl) propionate) components are omitted, thereby resulting in an uncured coating. The transparency of the resultant film is then determined by spectrophotometric transmission readings on an IBM-7410 spectrophotometer. The results are shown in Table 2.

EXAMPLE 4

A coating solution is prepared as described in Example 2 and coated on both sides of a 3 mil Melinex 516 polyester film at a coating weight of 2 g/m$^2$. The transparency of the resultant film is then determined by spectrophotometric transmission readings on an IBM-7410 spectrophotometer. The results are shown in Table 2.

EXAMPLE 4A

A coating solution is prepared and coated as described in Example 4 except that the triethanolmine and trimethylolpropane-tris-($\beta$-(N-aziridinyl) propionate) components are omitted, thereby resulting in an uncured film. The transparency of the resultant film is then determined by spectrophotometric transmission readings on an IBM-7410 spectrophotometer. The results are shown in Table 2.

EXAMPLE 5

A coating solution is prepared as described in Example 2 and coated on a 3 mil Melinex 516 polyester film at a coating weight of 6 g/m$^2$. The transparency of the resultant film is then determined by spectrophotometric transmission readings on an IBM-7410 spectrophotometer. The results are shown in Table 2.

EXAMPLE 6

A coating solution is prepared as described in Example 2 and coated on both sides of a 3 mil Melinex 516 polyester film at a coating weight of 7 g/m$^2$. The transparency of the resultant film is then determined by specrophotometric transmission readings on an IBM-7410 spectrophotometer. The results are shown in Table 2.

EXAMPLE 7

A coating solution is prepared as described in Example 2 and coated on one side of a 3 mil Melinex 516 polyester film at a coating weight of 2 g/m$^2$. The transparency of the resultant film is then determined by spectrophotometric transmission readings on an IBM-7410 spectrophotometer. The results are shown in Table 2.

EXAMPLE 8

409 gm of a copolymer of 85% polymethyl methacrylate/15% methacrylic acid prepared by conventional solution polymerization (36% solids in methyl ethyl ketone) is dissolved in 712 gm of propylene glycol mono methyl ether and 446 gm of methyl ethyl ketone under moderate stirring. 1.5 g of triethanolamine is then added, followed by 4.27 g of trimethylolpropane-tris-($\beta$-(N-aziridinyl)propionate) and the stirring continued for 10 minutes to insure complete mixing. The solution is then coated on both sides of 3 mil Melinex 505, a polyester film subbed with an adhesion promoter to improve clarity, obtained from I.C.I., at a coating weight of 4.3 gm² using a kiss coating method of application. The coated film is then placed in an oven for about 1 minute at a drying temperature of 275° F. The transparency of the resultant film is then measured spectrophotometrically on an IBM-7410 spectrophotometer. The results are shown in Table 2.

TABLE 2

| Example | Transmission | Comments |
| --- | --- | --- |
| Uncoated Film | .059 | |
| 2 | .028 | Newton rings visible |
| 3 | .037 | Newton rings visible |
| 3A | .037 | Newton rings visible |
| 4 | .037 | Essentially negligible Newton ring effect |
| 4A | .037 | Essentially negligible Newton ring effect |
| 5 | .038 | No Newton rings visible |
| 6 | .040 | Film cracking evident |
| 7 | .046 | Essentially negligible Newton ring effect |
| 8 | .036 | No Newton rings visible |

In the above data it is evident that the transparency of polyester film is improved by applying the coating of this invention. While the coating of one side alone improves the transparency substantially, the coating of both sides shows the greatest improvement.

EXAMPLE 9

A light sensitive composition is prepared by dissolving 2.7 g of a copolymer of 85% polymethyl methacrylate/15% methacrylic acid binder in a solvent mixture comprising 35 g of methyl ethyl ketone, 20 g of propylene glycol methyl ether, and 20 g of diacetone alcohol under moderate stirring. The following dyes are then added: 0.4 g of calcozine yellow, 0.2 g of Rhodamine GDN and 0.1 g of Victoria Pure blue, while mixing. While the solution is still being mixed, 3.5 g of the condensation product of 3-methoxy-4-diazo diphenyl amine sulfate and 4,4'-bis-methoxy methyl diphenyl ether isolated as the mesitylene sulfonate is added followed by 3.0 g of hydroxy propyl cellulose available as Klucel MF from Hercules Corp. The entire formulation is stirred for thirty minutes after all the components have been added to insure complete mixing.

Meyer bar drawdowns are then used to apply this formulation to the films prepared in examples 3 and 4 at differing coating weights. The coated films are then exposed through a negative for twenty units on a Berkey-Ascor exposure unit and developed by hand with an aqueous alkaline developer comprising trisodium phosphate, monosodium phosphate, the sodium sulfate derivative of 7-ethyl-2-methyl-4-undecanol available as Niaproof 4 from Niacet Co. and water. The transparency of a clear portion of the resultant film is then measured by spectrophotometric transmission readings on an IBM-7410 spectrophotometer. The results are shown in Table 3.

TABLE 3

| Film from Example | Coating Weight | Transmission |
| --- | --- | --- |
| 3 | 4.25 g/m² | .036 |
| 3 | 5.05 g/m² | .037 |
| 4 | 5.52 g/m² | .037 |

No significant increases in the transmission values of the films are seen after imaging of the light sensitive top coat.

EXAMPLE 10

A light-sensitive composition is prepared by blending together 210 g of methyl ethyl ketone, 94.5 g of propylene glycol mono methyl ether and 140 g of diacetone alcohol under moderate stirring and then adding 21 g of Scripset 540, a styrene/maleic acid half ester copolymer having an average molecular weight from about 10,000 to 50,000 available from Monsanto, and stirring until the copolymer is dissolved. 1.75 g of p-toluene sulfonic acid and 10.5 g of the condensation product of 3-methoxy-4-diazo diphenyl amine sulfate and 4,4'-bis-methoxy methyl diphenyl ether isolated as the mesitylene sulfonate are then added while under continued stirring. In a separate vessel, 122.5 g of a white dispersion (50% solids in propylene glycol mono methyl ether) and 42 g of a black dispersion (25% solids in methyl ethyl ketone) are blended. The first mixture is then added to the dispersion blend and the entire formulation is stirred for thirty minutes to insure complete mixing.

This formulation is then applied to the film prepared in Example 8 by miniscus coating at a coating weight of 5.1 g/m². The coated film is then exposed through a negative for twenty units on a Berkey-Ascor exposure unit and developed by hand with the developer described in Example 9. The transparency of a clear portion of the resultant film is then measured by spectrophotometric transmission readings on an IBM-7410 spectrophotometer. This results in a transmission reading of 0.037.

Again, no significant increases in the transmission values of the films are seen after imaging of the light sensitive top coat.

I claim:

1. A substantially transparent polyester film having improved transparency, said polyester film having a substantially transparent non-light sensitive coating directly coated thereon, said coating consisting essentially of a copolymer of polymethyl methacrylate and methacrylic acid having a refractive index of less than about 1.6.

2. The film of claim 1 wherein said polyester film comprises a film of polyethylene terephthalate.

3. The film of claim 1 wherein said coating further comprises a curing agent for the copolymer.

4. The film of claim 3 wherein said curing agent comprises a polyfunctional aziridine.

5. The film of claim 4 wherein said curing agent is selected from the group consisting of trimethylolpropane-tris-($\beta$-(N-aziridinyl) propionate) and pentaerythritol-tris-($\beta$-(N-aziridinyl) propionate.

6. The film of claim 3 wherein said coating further comprises an accelerator for the cure of said copolymer.

7. The film of claim 6 wherein said accelerator is triethanolamine.

8. The film of claim 1 wherein said copolymer comprises about 80% to about 95% by weight of polymethyl methacrylate and about 5% to about 20% by weight of methacrylic acid.

9. The film of claim 8 wherein said copolymer comprises about 85% by weight of polymethyl methacrylate and about 15% by weight of methacrylic acid.

10. The film of claim 8 wherein said copolymer is coated on both sides of said polyester film.

11. The film of claim 8 wherein said copolymer comprises about 95% by weight of polymethyl methacrylate and about 5% by weight of methacrylic acid.

12. The film of claim 11 wherein said copolymer is coated on one side of said polyester film.

13. A substantially transparent polyester film having improved transparency, said polyester film having a substantially transparent non-light sensitive composition directly coated thereon, said coating composition consisting essentially of a copolymer of polymethyl methacrylate and methacrylic acid wherein said copolymer comprises at least about 50% by weight, based on the weight of said copolymer, polymethyl methacrylate and wherein said coating composition has a refractive index of less than about 1.6.

14. The film of claim 13 wherein said copolymer comprises from about 80% to about 95% by weight, based on the weight of said copolymer, polymethyl methacrylate and from about 5% to about 20% by weight, based on the weight of said copolymer, methacrylic acid.

15. The film of claim 13 wherein said coating composition further comprises a curing agent for said copolymer in admixture therewith.

16. The film of claim 15 wherein said copolymer comprises from about 80% to abut 95% by weight, based on the weight of said copolymer, polymethyl methacrylate and from abut 5% to about 20% by weight, based on the weight of said copolymer, methacrylic acid.

17. The film of claim 15 wherein said curing agent is selected from the group consisting of trimethylolpropane-tris-($\beta$-(N-aziridinyl) propionate) and pentaerythritol-tris-($\beta$-(N-aziridinyl) propionate).

18. The film of claim 17 wherein said coating composition further comprises triethanolamine.

19. The film of claim 15 wherein said coating composition further comprises an accelerator in admixture therewith.

20. The film of claim 19 wherein said accelerator is triethanolamine.

* * * * *